(12) United States Patent
Lin et al.

(10) Patent No.: US 7,222,321 B2
(45) Date of Patent: May 22, 2007

(54) SYSTEM AND METHOD FOR MANIPULATING AN INTEGRATED CIRCUIT LAYOUT

(75) Inventors: Po Huang Lin, Hsinchu (TW); Yi Jen Su, Hsinchu (TW); Miin Chih Shih, Hsinchu (TW)

(73) Assignee: Anaglobe Technology, Inc., Hsinchu (TW)

( * ) Notice: Subject to any disclaimer, the term of this patent is extended or adjusted under 35 U.S.C. 154(b) by 0 days.

(21) Appl. No.: 11/125,168

(22) Filed: May 10, 2005

(65) Prior Publication Data

US 2006/0259882 A1    Nov. 16, 2006

(51) Int. Cl.
*G06F 17/50* (2006.01)

(52) U.S. Cl. ........................................ 716/11

(58) Field of Classification Search ................. 716/11, 716/8

See application file for complete search history.

(56) References Cited

U.S. PATENT DOCUMENTS

| | | | |
|---|---|---|---|
| 5,212,653 A * | 5/1993 | Tanaka | 716/8 |
| 6,009,251 A * | 12/1999 | Ho et al. | 716/5 |
| 6,449,757 B1 | 9/2002 | Karniewicz | |
| 6,457,163 B1 | 9/2002 | Yang | |
| 6,802,050 B2 * | 10/2004 | Shen et al. | 716/8 |
| 6,804,809 B1 | 10/2004 | West et al. | |
| 6,920,620 B2 * | 7/2005 | Hsiao et al. | 716/4 |
| 7,124,382 B1 * | 10/2006 | Eccles et al. | 716/5 |
| 2003/0005399 A1 * | 1/2003 | Igarashi et al. | 716/8 |
| 2003/0135831 A1 | 7/2003 | Hsiao et al. | |
| 2004/0243949 A1 * | 12/2004 | Wang et al. | 716/4 |
| 2004/0250233 A1 * | 12/2004 | Sinha et al. | 716/19 |
| 2005/0086626 A1 * | 4/2005 | Sato et al. | 716/11 |
| 2005/0183053 A1 * | 8/2005 | Ishizuka | 716/10 |
| 2005/0209829 A1 * | 9/2005 | Binzer et al. | 703/1 |
| 2006/0036978 A1 * | 2/2006 | Fukuzono et al. | 716/4 |

* cited by examiner

*Primary Examiner*—Paul Dinh
*Assistant Examiner*—Suchin Parihar
(74) *Attorney, Agent, or Firm*—Volentine & Whitt, PLLC

(57) ABSTRACT

A system and method for manipulating an integrated circuit layout allowing for reuse and migration. The method comprises steps of identifying objects in a geometric layout to generate a first symbolic layout, nesting a plurality of objects in the first symbolic layout to generate a first virtual device, and associating the first virtual device to generate a second symbolic layout. The method further comprises a step of modifying parameters and constraints of the first virtual device to generate a third virtual device, and a step of optimizing a second symbolic layout including the first virtual devices to generate a third symbolic layout based on the third virtual device. Consequently, the second symbolic layout can be reused. Further, the method comprises a step of updating parameters and constraints of the first virtual device based on new process rules to generate a fourth virtual device so that the second symbolic layout can be used to generate a third symbolic layout for migration.

6 Claims, 12 Drawing Sheets

Process Layers Definition

| Layer name | Layer # |
|---|---|
| Well (p.n) | 1 |
| Active Area (n+, p+) | 2... |
| Select (n+, p+) | 5... |
| Polysilicon | 6 |
| Metal 1 | 8 |
| Contact | 13 |
| Metal 2 | 18 |
| Via | 23 |

FIG. 1(a)

Layer Attributes Categorization

| Layer purpose | Process layer |
|---|---|
| Connect 1 | Poly1, poly2... |
| Connect 2 | Metal 1, Metal 2, Metal 3... |
| Cut | Contact, Via1, Via2... |
| Active | P Diffusion, N Diffusion |
| Select | P Implant, N Implant |
| Substrate | P Well, n Well |
| Option-layer | Buried, dummy, shadow |

FIG. 1(b)

Layers Operation

| Derived-layer | | Boolean operation | layer | Boolean operation | layer |
|---|---|---|---|---|---|
| gate | = | & | active | | |
| cont | = | & | active | & | connect 2 |
| cont | = | & | connect 1 | & | connect 2 |
| via | = | & | connect 2 | & | connect 2 |

FIG. 1(c)

| PRIMITIVE OBJECT | Main object layer | Attach layer 1 | Attach layer 2 | Attach layer 3 | Attach layer 4 | Condition |
|---|---|---|---|---|---|---|
| PC | connect 1 | cont | connect 2 | N/A | N/A | |
| DC | active | cont | connect 2 | Select | Substrate | |
| VC | connect 2 | via | connect 2 | N/A | N/A | |
| MG | active | Gate | connect 1 | Select | Substrate | |
| Wire-e | active | N/A | N/A | Select | Substrate | Both end w/ same net |
| Wire-b | connect 1 | N/A | | | | Both end w/ same net |
| Wire-c | connect 2 | | | | | Both end w/ same net |
| CA | connect 1 | connect 1 | | | | Both end w/ different Polar |
| CB | connect 2 | connect 2 | | | | Both end w/ different Polar |
| CC | connect 1 | connect 2 | | | | Both end w/ different Polar |
| RA | active | | | Select | | Both end w/ different Polar |
| RB | connect 1 | | | | | Both end w/ different Polar |
| RC | Substrate | | | | | Both end w/ different Polar |

FIG. 2

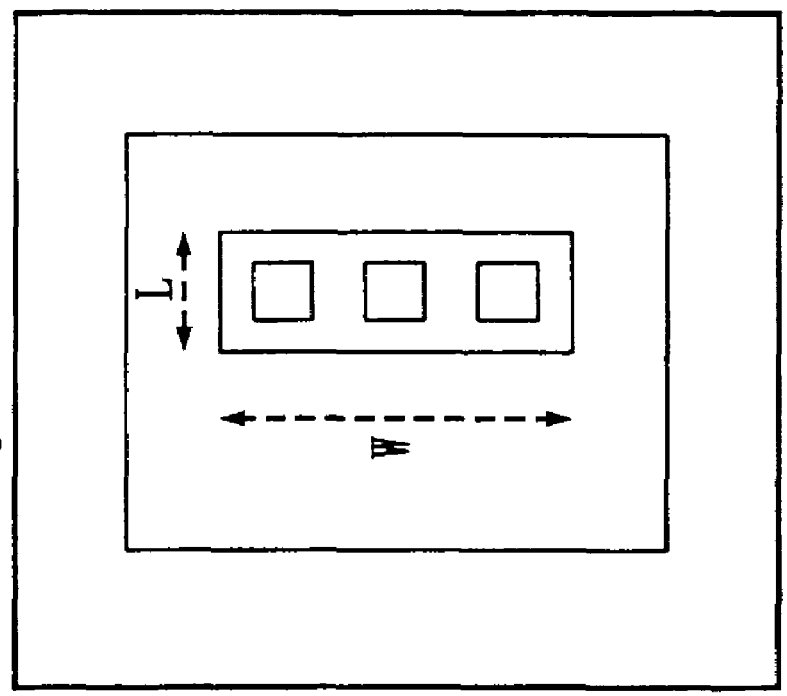
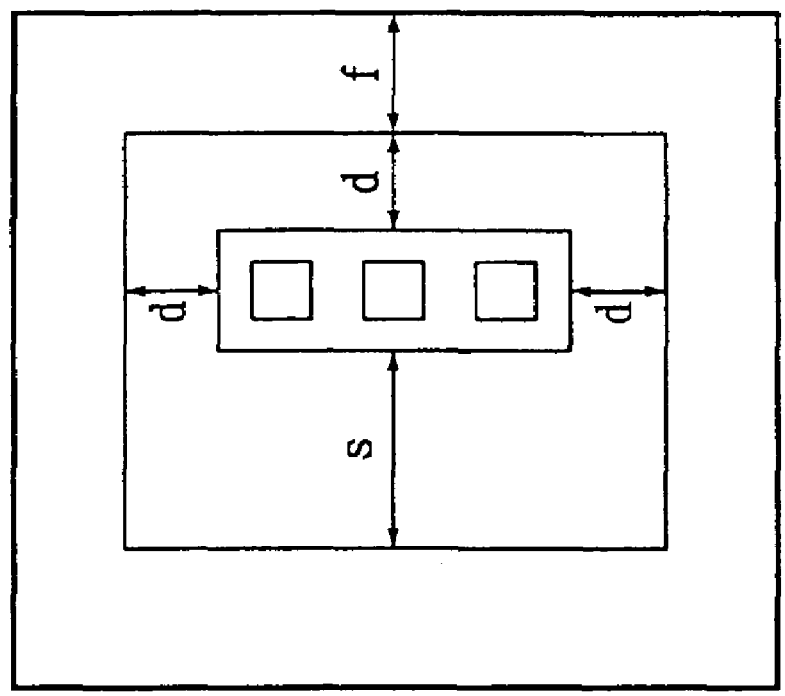
FIG. 6

▨ :path object  ▦ :gate object  ☐ :virtual device

UD# :user defined virtual device
W :wire virtual device
▨ :connect-point between virtual devices

SYSTEM AND METHOD FOR MANIPULATING AN INTEGRATED CIRCUIT LAYOUT

BACKGROUND OF THE INVENTION (A) Field of the Invention

The present invention relates to a system and method for constructing variations from an integrated circuit layout, and more particularly, to a system and method for manipulating an integrated circuit layout allowing for reuse and migration.

(B) Description of the Related Art

Semiconductor circuits or chips have become widely used in articles for daily use. A typical electronic circuit design is initially conceived and tested schematically by a circuit design engineer; with a number of components and devices connected together to yield a circuit with desired performance characteristics. Once the circuit has been designed, it must be reconfigured from schematic form into a geometric layout form. This is typically a job for a physical design engineer, working in concert with the circuit design engineer to create a graphic layout specifying a suitable semiconductor implementation of the circuit. The geometric layout of the device, which specifies all of the semiconductor device layout parameters, is then submitted to a foundry for fabrication of the chip.

Configuring the geometric layout from the schematic form for an electronic circuit is a very complicated task, and is governed by a large number of geometric rules. A geometric layout of a semiconductor device contains geometric features such as polygons to indicate the proper size, shape, location and separation of a certain physical feature of the circuit, distinguishing it from other physical features, or to indicate proper isolation and separation among the circuit elements. The geometric layout of a typical semiconductor device contains multiple drawing layers, each layer having one or more polygons. Generally, the more complicated the device is, the more layers and polygons the layout includes.

In addition, to layout another semiconductor device, the circuit design engineer and the physical design engineer have to restart the complicated task. Even the circuit design of the semiconductor device is to be fabricated by a new fabrication process rather than a predetermined process; the circuit design engineer and the physical design engineer have to modify the parameters of the circuit layout to meet constraints of the new fabrication process, which is time-consuming and error prone. In other words, the prior art consumes a lot of effort for the existing layout to be reused or migrated to a different fabrication process.

SUMMARY OF THE INVENTION

A system for manipulating an integrated circuit layout allowing for reuse and migration comprises an object extractor for identifying primitive objects in a geometric layout to generate a first symbolic layout based on the criteria of a technology file, a nester for nesting a plurality of primitive objects to generate a first virtual device in the first symbolic layout, a recognizer for associating first virtual devices in first symbolic layout to generate a second symbolic layout, an optimizer for optimizing the second symbolic layout to generate a third symbolic layout. The object extractor is configured to identify the primitive object in the geometric layout based on the primitive object model that was taken from the technology file, which identifies the parameters and constraints of primitive objects.

A method for manipulating an integrated circuit layout allowing for reuse and migration comprises steps of receiving a geometric layout, identifying primitive objects in the geometric layout to generate a first symbolic layout based on the criteria of a technology file, nesting a plurality of primitive objects to generate a first virtual device in the first symbolic layout, and associating first virtual devices in the first symbolic layout to generate a second symbolic layout. The method may further comprise a step of including additional primitive objects to the first virtual device to generate a second virtual device after the step of associating the first virtual device in the second symbolic layout, and a step of associating the second virtual devices in the second symbolic layout.

In addition, the method may further comprise a step of adding new constraints and parameters or a step of modifying the parameters and the constraints of the first/second virtual device to generate a third virtual device, and a step of optimizing the second symbolic layout including first/second virtual devices to generate the third symbolic layout based on the third virtual device. Consequently, the second symbolic layout can be reused to generate the third symbolic layout. Further, the method may comprise a step of updating the parameter and the constraint of the first/second virtual device based on rules of a predetermined fabrication process to generate a fourth virtual device, and a step of optimizing a second symbolic layout including the first/second virtual devices to generate a third symbolic layout based on the fourth virtual device. As a result, the second symbolic layout can be used to generate a third symbolic layout for migrating to a new fabrication process.

BRIEF DESCRIPTION OF THE DRAWINGS

The primitive objectives and advantages of the present invention will become apparent upon reading the following description and upon reference to the accompanying drawings in which:

FIG. 1(a) to FIG. 1(c) show some process layer information of a technology file;

FIG. 2 shows some primitive object models according to one embodiment of the present invention;

FIG. 6 show the definition of some parameters and the constraints;

DETAILED DESCRIPTION OF THE INVENTION

FIG. 1(a) shows some layer information of a technology file. The present method categorizes the process layer information based on the property of the layer information, such as the composition or function of the layer, into several layer classes, as shown in FIG. 1(b). For example, "Poly 1" and "Poly 2" are categorized in the class "connect 1" in FIG. 1(b). The Boolean operation can then be used to identify the basic structure such as gate or via based on the combination of layers belonging to different classes. For example, poly & active=gate, as shown in the first row of FIG. 1(c).

Figure 3A:
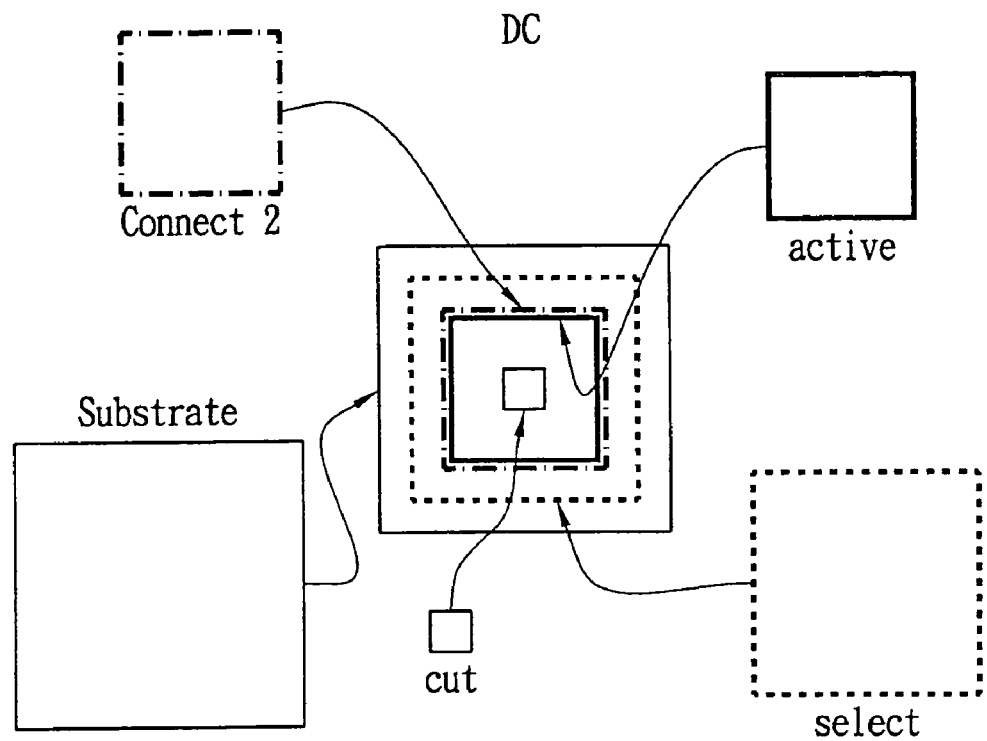
FIG. 3(a) and FIG. 3(b) illustrate two primitive object layouts of FIG. 2.
Figure 3B:
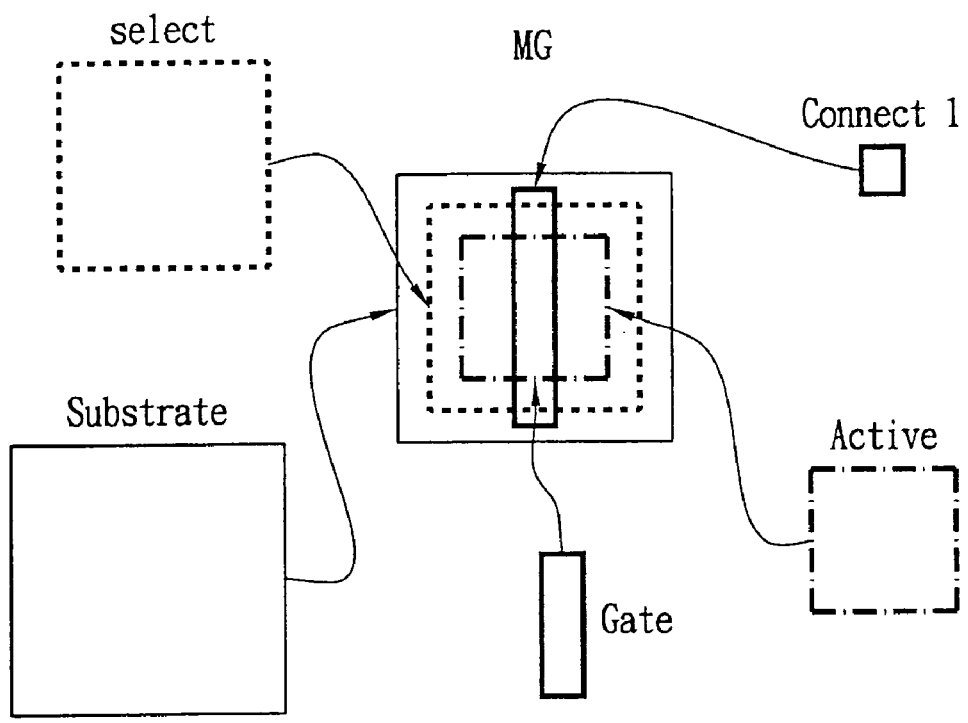

FIG. 2 shows some primitive object models according to one embodiment of the present invention, and FIG. 3(a) and FIG. 3(b) illustrate two primitive object layouts, DC and MG, of FIG. 2. Referring to FIG. 3(a) together with FIG. 2, primitive object DC consists of a substrate, a connect 2, an active, a select and a cut. Referring to FIG. 3(b) together with FIG. 2, primitive object MG consists of a substrate, a select, a connect 1, an active, and a gate.

Figure 4:
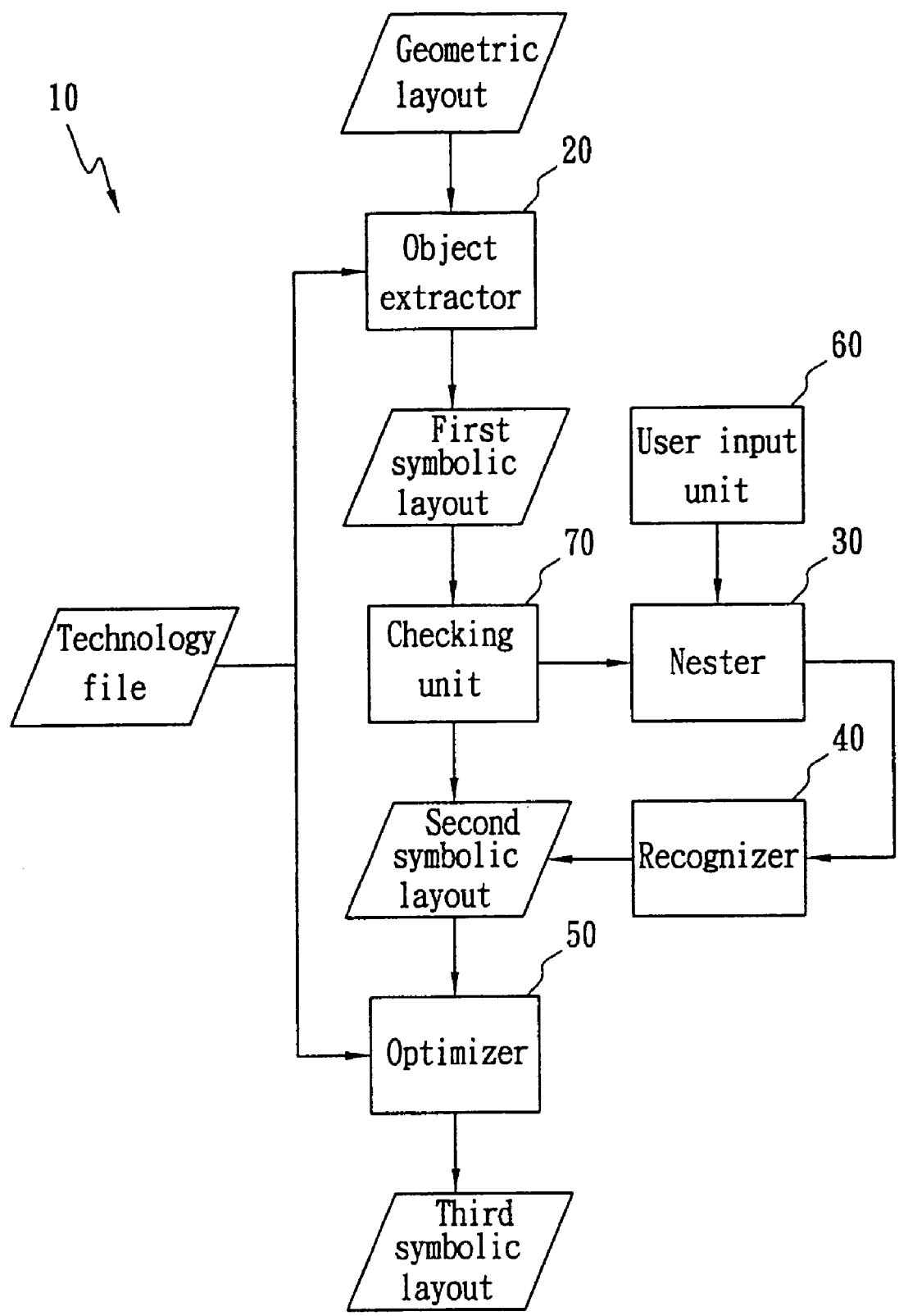
FIG. 4 is a schematic diagram of a system for manipulating an integrated circuit layout according to one embodiment of the present invention.
Figure 10:
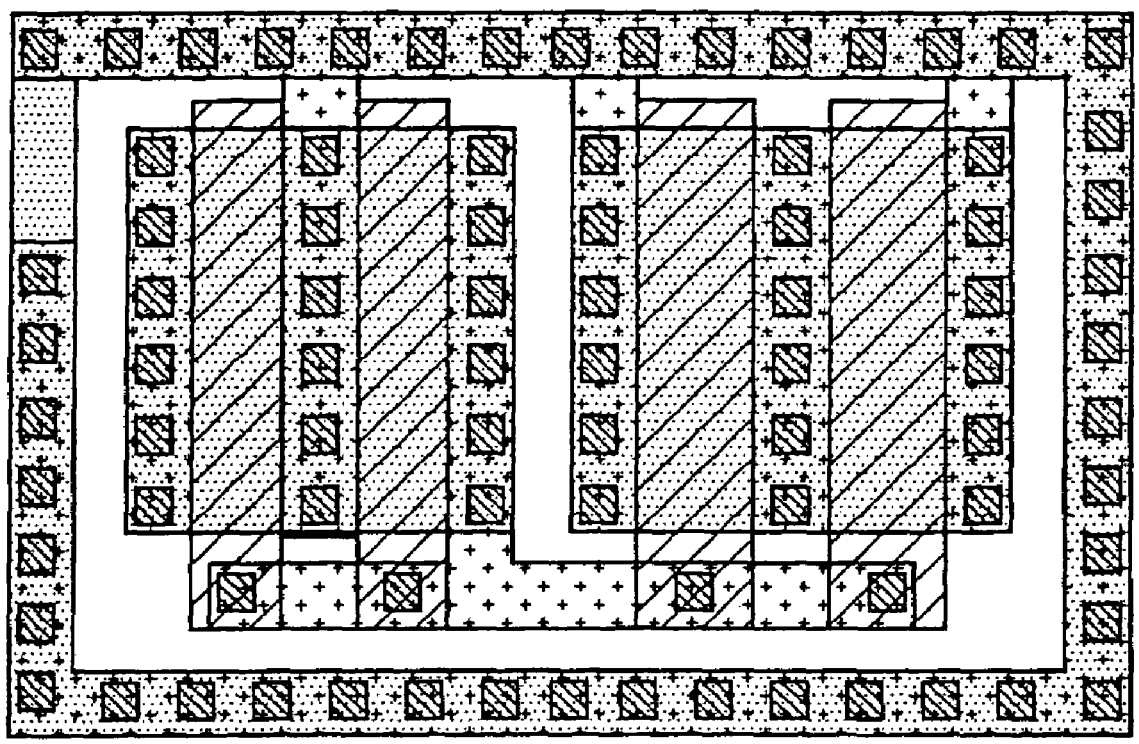
FIG. 10 illustrates a portion of a geometric layout according to one embodiment of the present invention.
Figure 11:
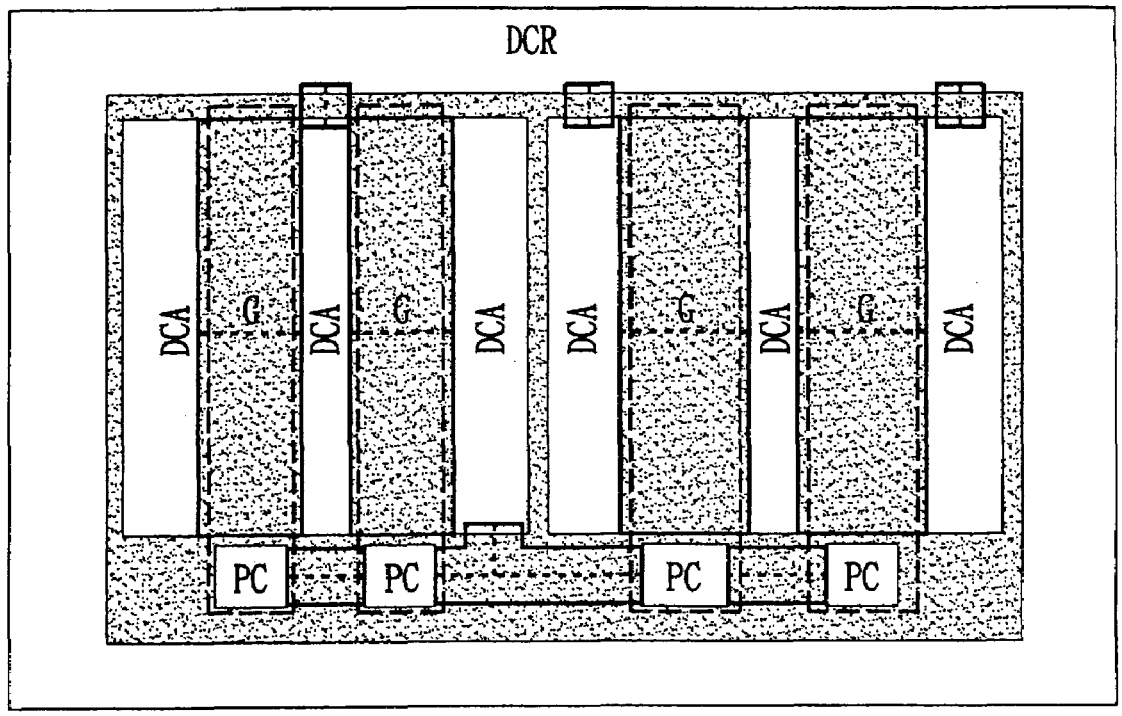
FIG. 11 illustrates a portion of a first symbolic layout according to one embodiment of the present invention.
Figure 12:
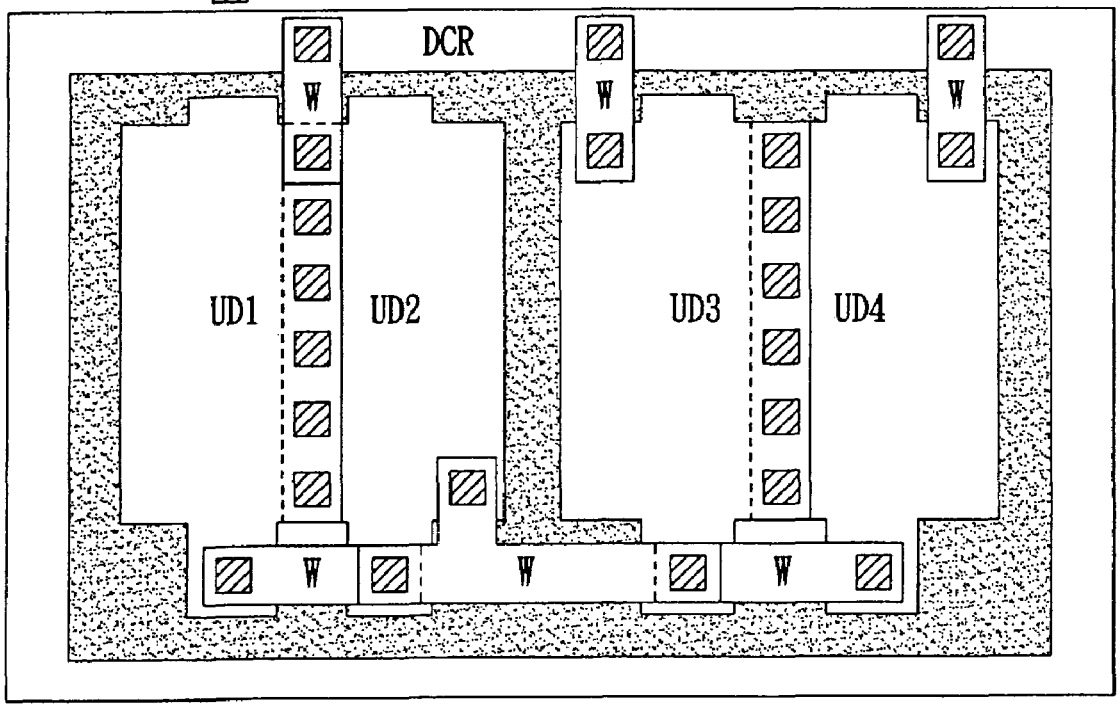
FIG. 12 illustrates a portion of a second symbolic layout according to one embodiment of the present invention.

FIG. 4 is a schematic diagram of a system 10 for manipulating an integrated circuit layout according to one embodiment of the present invention. The system 10 comprises an object extractor 20 for identifying primitive objects in a geometric layout as shown in FIG. 10, which only illustrates a portion of the geometric layout, to generate a first symbolic layout as shown in FIG. 11 based on the criteria of a technology file, a nester 30 for nesting a plurality of primitive objects to generate a virtual devices in the first symbolic layout, a recognizer 40 for associating the virtual devices to generate a second symbolic layout as shown in FIG. 12, an optimizer 50 for optimizing the second symbolic layout to generate a third symbolic layout, an input device 60 for a user to add new parameters and constraints for the virtual device, and a checking unit for checking if the first symbolic layout needs further identification and association. Particularly, the object extractor 20 is configured to identify the primitive object in the geometric layout based on the primitive object model, and the optimizer 50 is configured to optimize the second symbolic layout using the virtual device as an individual.

Figure 5:
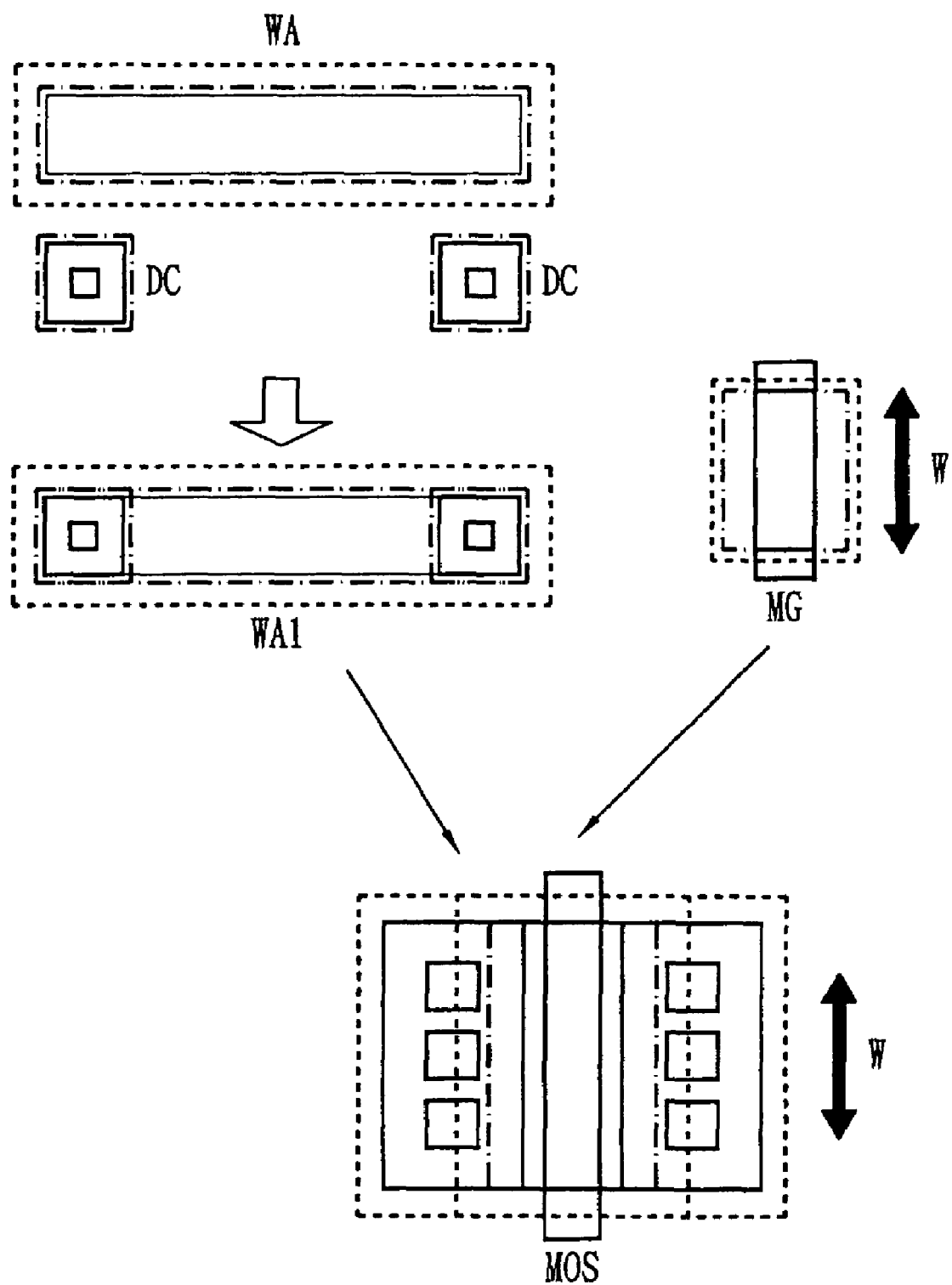
FIG. 5 shows the operation of the nester according to one embodiment of the present invention.

FIG. 5 shows the operation of the nester 30 according to one embodiment of the present invention. The nester 30 groups one primitive object "WA" with two primitive objects "DC" to form a first virtual device "WA1" (first level nesting). The recognizer 40 can then identify and associate the first virtual devices "WA1" in the first symbolic layout. The nester 30 can further add another primitive object "MG" to the first virtual device to form the second virtual device "MOS" (second level nesting). Subsequently, a user can add constraints and parameters to the second virtual device, as shown in FIG. 6. Similarly, the recognizer 40 can then identify and associate the second virtual device "MOS" in the second symbolic layout. Consequently, a user can build an even higher-level virtual device other than the second virtual device by the nester 30 and the recognizer 40.

Figure 7:
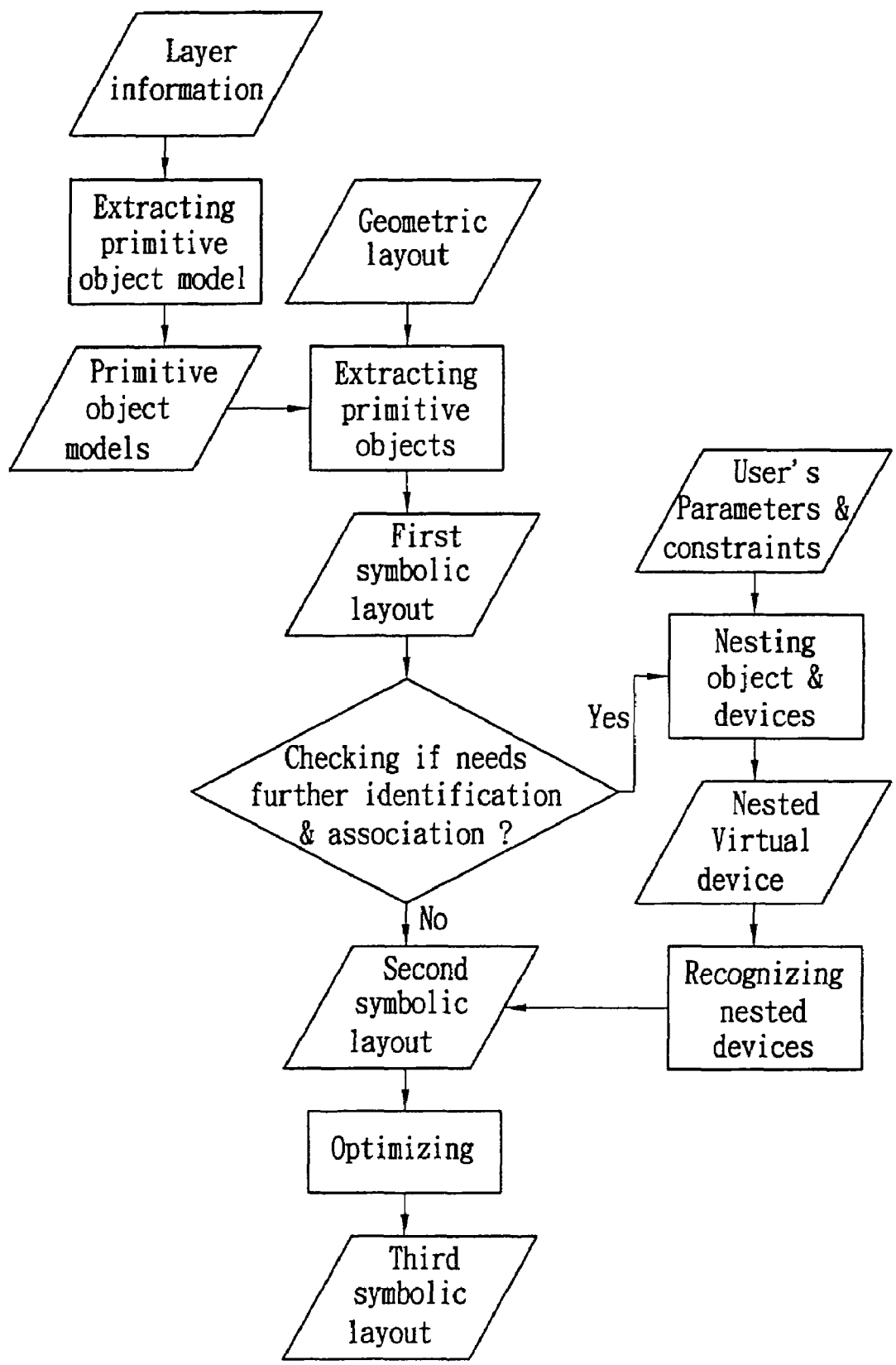
FIG. 7 is a flow chart of the method for manipulating an integrated circuit layout according to one embodiment of the present invention.

FIG. 7 is a flow chart of the method for manipulating an integrated circuit layout according to one embodiment of the present invention. The method extracts primitive object models based on the layer information of the technology file, as shown in FIG. 3(a) and FIG. 3(b). The method then extracts primitive objects from a user's geometric layout based on primitive models, as shown in FIG. 6. Subsequently, if the first symbolic layout does not need further identification and association, an optimizing conversion step is performed to optimize the second symbolic layout to form a third symbolic layout based on the primitive objects and the embedded parameters and constraints.

On the other hand, a nesting step can be performed to group a plurality of primitive objects to generate a first virtual device, and an associating step can then be performed to associate the first virtual device within the first symbolic layout. The method may further comprise a step of including additional primitive objects to the first virtual device to generate a second virtual device after the step of associating the first virtual device in the second symbolic layout, and a step of associating the second virtual device in the second symbolic layout. That is, repeating the nesting step and the associating step. In addition, users may add new parameters and constraints to the virtual device. Finally, the second symbolic layout is optimized to generate the third symbolic layout based on the virtual devices and the embedded parameters and constraints.

Figure 8:
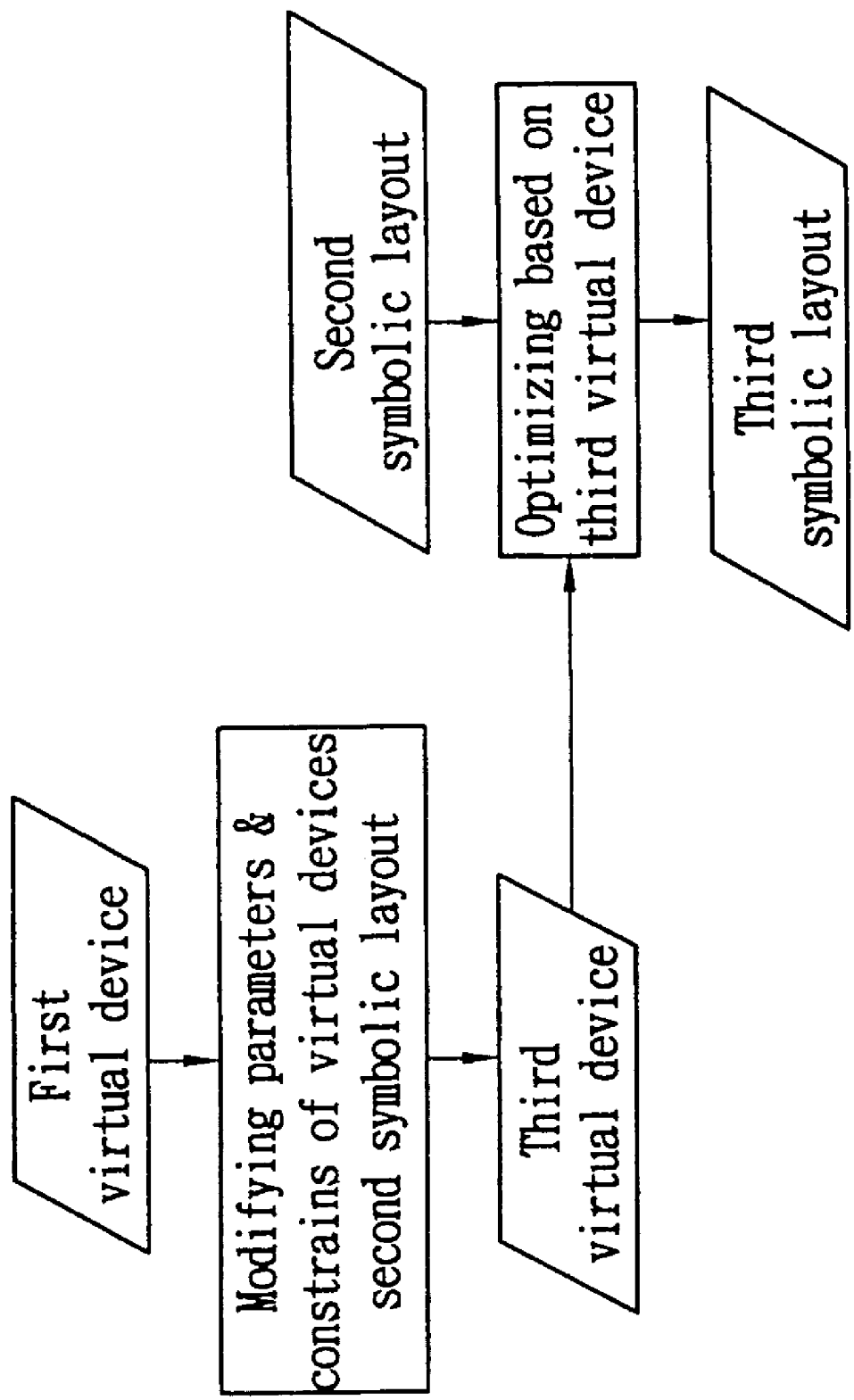
FIG. 8 is a flow chart showing the reuse of the virtual device according to one embodiment of the present invention.

FIG. 8 is a flow chart showing the reuse of the virtual device according to one embodiment of the present invention. The first virtual device is generated by the above-mentioned process shown in FIG. 5, and the first symbolic layout is modified to generate the second symbolic layout by the method shown in FIG. 7. The parameters and constraints of the first virtual device are modified to form a third virtual device, and the step of optimizing is performed to optimize the second symbolic layout including the first/second virtual devices to generate a third symbolic layout based on the third virtual devices, i.e., using the virtual device as an individual rather than as a group of primitive objects. Consequently, the second symbolic layout can be reused to generate the third symbolic layout by updating the first/second virtual device using the third virtual device.

Figure 9:
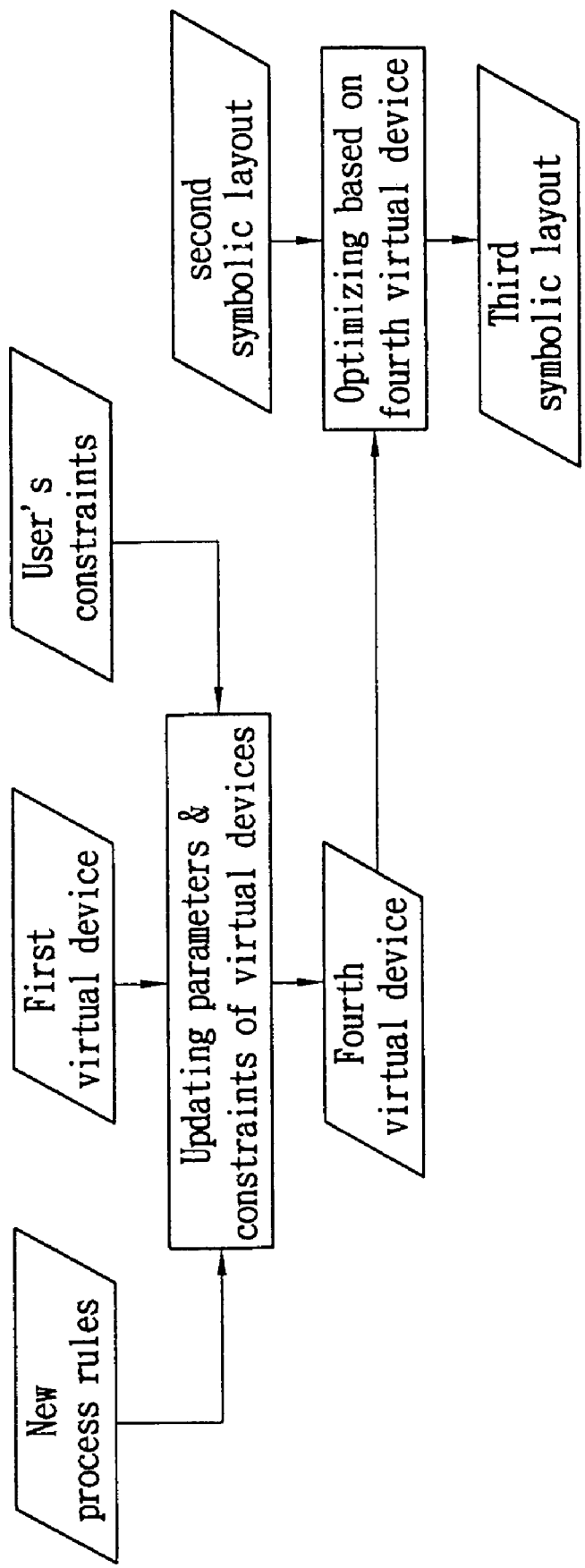
FIG. 9 is a flow chart showing the migration of the virtual device according to one embodiment of the present invention.

FIG. 9 is a flow chart showing the migration of the virtual device according to one embodiment of the present invention. The parameters and constraints of the first/second virtual device are updated to form a fourth virtual device, based on rules of the new fabrication process and the user's constraints. A step of optimizing is performed to optimize the second symbolic layout including the first/second virtual devices to generate a third symbolic layout based on the fourth virtual devices. As a result, the second symbolic layout can be used to generate a third symbolic layout for migrating to a new fabrication process.

The above-described embodiments of the present invention are intended to be illustrative only. Numerous alternative embodiments may be devised by those skilled in the art without departing from the scope of the following claims.

What is claimed is:

1. A method for manipulating an integrated circuit layout, comprising:
   receiving a geometric layout;
   identifying primitive objects in the geometric layout to generate a first symbolic layout based on a technology file;
   nesting a plurality of primitive objects to generate a first virtual device in the first symbolic layout;
   associating the first virtual device to generate a second symbolic layout;
   adding additional primitive objects to the first virtual device to generate a second virtual device after associating the first virtual device;
   associating the second virtual device;
   modifying parameters and constraints of the first virtual device to generate a third virtual device;
   updating parameters and constraints of the first virtual device based on rules of a new fabrication process to generate a fourth virtual device;

optimizing the second symbolic layout including the first virtual device to generate a third symbolic layout based on the fourth virtual device; and adding constraints to the fourth virtual device.

2. The method for manipulating an integrated circuit layout of claim 1, further comprising extracting primitive object models from a layer information that is stored in the technology file.

3. The method for manipulating an integrated circuit layout of claim 2, wherein said identifying primitive objects in the geometric layout is based on the primitive object models.

4. The method for manipulating an integrated circuit layout of claim 2, wherein said extracting primitive object models from layer information that is stored in the technology file comprises categorizing the layer information based on properties of the layer information.

5. The method for manipulating an integrated circuit layout of claim 1, further comprising adding parameters to the first virtual device.

6. A method for manipulating an integrated circuit layout, comprising:

receiving a geometric layout;

identifying primitive objects in the geometric layout to generate a first symbolic layout based on a technology file;

nesting a plurality of primitive objects to generate a first virtual device in the first symbolic layout; and associating the first virtual device to generate a second symbolic layout, wherein said identifying primitive objects in the geometric layout comprises extracting primitive object models from layer information that is stored in the technology file, and wherein said extracting primitive object models from layer information that is stored in the technology file comprises categorizing the layer information based on properties of the layer information.

* * * * *